US011604539B2

United States Patent
Finnoey et al.

(10) Patent No.: US 11,604,539 B2
(45) Date of Patent: Mar. 14, 2023

(54) AMPLIFIED CHARGE CANCELLATION IN A TOUCH SENSOR, AND RELATED SYSTEMS, METHODS, AND DEVICES

(71) Applicant: Microchip Technology Incorporated, Chandler, AZ (US)

(72) Inventors: Torbjoern Loevseth Finnoey, Trondelag (NO); Lei Zou, Langhus (NO)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 17/301,744

(22) Filed: Apr. 13, 2021

(65) Prior Publication Data
US 2021/0333924 A1    Oct. 28, 2021

Related U.S. Application Data

(60) Provisional application No. 63/013,721, filed on Apr. 22, 2020.

(51) Int. Cl.
*G06F 3/041* (2006.01)
*G06F 3/044* (2006.01)
(52) U.S. Cl.
CPC ............ *G06F 3/0418* (2013.01); *G06F 3/044* (2013.01)
(58) Field of Classification Search
None
See application file for complete search history.

(56) References Cited

U.S. PATENT DOCUMENTS

| | | | |
|---|---|---|---|
| 2006/0138574 A1 | 6/2006 | Saito et al. | |
| 2014/0306923 A1* | 10/2014 | Brillant | G06F 3/04182 |
| | | | 345/174 |
| 2015/0115977 A1 | 4/2015 | Bohannon et al. | |
| 2016/0334902 A1 | 11/2016 | Li et al. | |
| 2017/0344144 A1* | 11/2017 | Pedersen | G06F 3/045 |
| 2018/0284919 A1 | 10/2018 | Kaddouri et al. | |
| 2019/0302928 A1* | 10/2019 | Yuan | G06F 3/04166 |

OTHER PUBLICATIONS

International Search Report from International Application No. PCT/US2021/070381, dated Jul. 2, 2021, 4 pages.
International Written Opinion from International Application No. PCT/US2021/070381, dated Jul. 2, 2021, 8 pages.
El Feki et al., "High performance dual-output second and third generation current-mode multifunction filter application," 2009 6th International Multi-Conference on Systems, Signals and Devices, Djerba, Tunisia, 2009, pp. 1-6.

* cited by examiner

*Primary Examiner* — Stephen T. Reed
(74) *Attorney, Agent, or Firm* — TraskBritt

(57) ABSTRACT

A charge compensation circuit is disclosed that provides amplified charge cancellation. A touch controller is disclosed that includes such a charge compensation circuit and may realize improved immunity to baseline capacitance signals that are much larger than a change in capacitance due to proximity of an object. Such a charge compensation circuit may include a capacitor, a driver circuit arranged to apply a pulsed voltage signal to the capacitor, and a current conveyor having a programmable gain and arranged to amplify an initial charge generated by the capacitor in response to the pulsed voltage signal and provide an amplified charge to an output of the charge cancellation circuit.

15 Claims, 5 Drawing Sheets

AMPLIFIED CHARGE CANCELLATION IN A TOUCH SENSOR, AND RELATED SYSTEMS, METHODS, AND DEVICES

CROSS-REFERENCE TO RELATED APPLICATION

This application claims the benefit under 35 U.S.C. § 119(e) of U.S. Provisional Patent Application Ser. No. 63/013,721, filed Apr. 22, 2020, the disclosure of which is hereby incorporated herein in its entirety by this reference.

TECHNICAL FIELD

This description relates, generally, to a charge compensation circuit that provides amplified charge cancellation, including in touch sensing systems, that, in some embodiments, provides improved charge cancellation without at least some of the drawbacks associated with some conventional charge cancellation techniques and charge compensation circuits.

BACKGROUND

Capacitive touch sensors are sometimes used to detect objects. In the case of a capacitive touch sensor that measure self-capacitance, when an object is in proximity to the capacitive touch sensor, the object induces a change in self-capacitance at the sensor lines of the capacitive touch sensor. A measurement circuit can observe the change in self-capacitance by measuring the self-capacitance of a sensor line and detecting, as non-limiting examples, a change in measured values or a difference between a measured value and a threshold.

BRIEF DESCRIPTION OF THE DRAWINGS

To easily identify the discussion of any particular element or act, the most significant digit or digits in a reference number refer to the figure number in which that element is first introduced.

DETAILED DESCRIPTION

Figure 1:
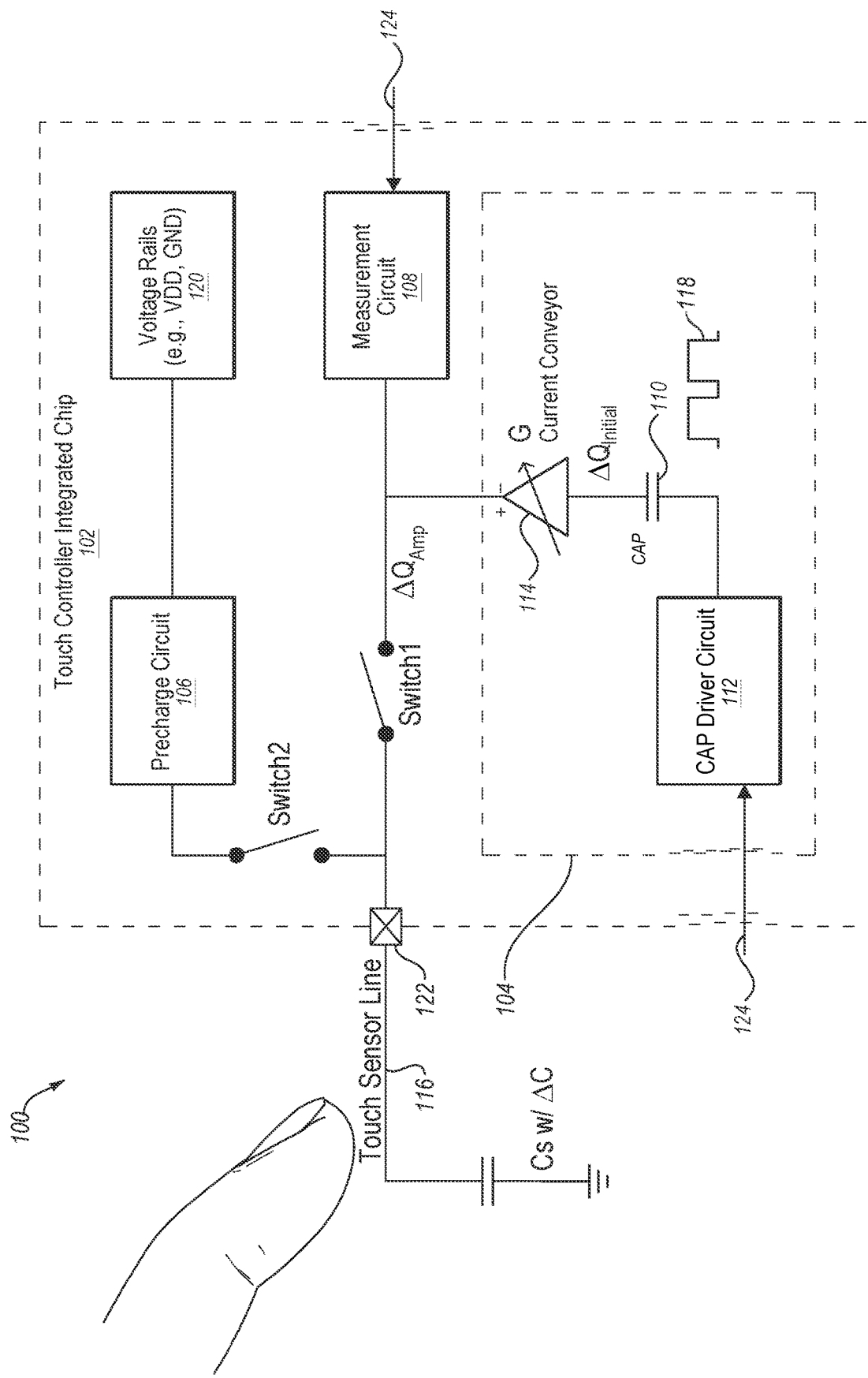
FIG. 1 depicts a schematic diagram of a touch controller that includes an amplified charge cancellation circuit, in accordance with one or more embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances, similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein—all of which are encompassed by use of the term "processor." A general-purpose processor may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code, without limitation) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least 90% met, at least 95% met, or even at least 99% met.

As used herein, any relational term, such as "over," "under," "on," "underlying," "upper," "lower," etc., is used for clarity and convenience in understanding the disclosure and accompanying drawings and does not connote or depend on any specific preference, orientation, or order, except where the context clearly indicates otherwise.

In this description the term "coupled" and derivatives thereof may be used to indicate that two elements co-operate or interact with each other. When an element is described as being "coupled" to another element, then the elements may be in direct physical or electrical contact or there may be intervening elements or layers present. In contrast, when an element is described as being "directly coupled" to another element, then there are no intervening elements or layers present. The term "connected" may be used in this description interchangeably with the term "coupled," and has the same meaning unless expressly indicated otherwise or the context would indicate otherwise to a person having ordinary skill in the art.

When an object contacts a capacitive sensor or a capacitive influence of an object in contact with a capacitive sensor changes, a change in capacitance may occur within the capacitive sensor ("sensor capacitance") at or near the location of the contact. An amount of transferred charge may be converted to digital values by an analog-to-digital converter (ADC), and a processor may process those digital values to determine capacitance and change in capacitance, or detect a touch, without limitation.

A self-capacitance sensor (which may be referred to herein as a "self-cap sensor") is capacitive field sensor that individually (or in a case of a sensor array, collectively) responds to changes in capacitance to ground. They are typically laid out in an array of rows and columns that react independently to contact or changes in an object in contact with the sensor. By way of non-limiting example, a self-cap sensor may include a circuit employing repetitive charge-then-transfer cycles using common integrated CMOS push-pull driver circuitry having floating terminals.

Mutual capacitance sensors are capacitive field sensors that respond to changes in capacitance between two electrodes: a drive electrode and a sense electrode. The drive electrode and sense electrode pairs at each intersection of drive lines and sense lines form a capacitor. Such a pair of a drive electrode and a sense electrode may be referred to herein as a "capacitive sensor."

Generally, sensor lines of a touch sensor may be arranged in two-dimensional (2D) grid of N by M sensor lines that provide a touch sensitive surface for a touch pad, a touch display, or a level sensor, without limitation. The sensor lines may be formed on or in, or be otherwise supported by, a support structure that includes, or is, one or more materials such as resins, glass, and plastic, without limitation. In some cases, the same material or another material may provide insulating protective overlays to cover a touch sensor.

Self-capacitance and mutual capacitance techniques may be used in a same capacitive sensing system, and complimentary to each other, for example, self-capacitance may be used to confirm contact or change in an object that is detected using mutual capacitance.

As an example, capacitive sensors may be overlaid in a 2-dimensional (2D) arrangement for a 2-D contact sensitive surface and may facilitate level sensing with an associated material or device or user interaction with an associated device or appliance. Insulating protective layers (e.g., resins, glass, and/or plastic, without limitation) may be used to cover capacitive sensors and may be referred to herein as an "overlay." Such a 2-dimensional arrangement with or without an overlay may be referred to herein as a "capacitive sensor array." In some applications, a protective layer may be glass, a housing, paint or another coating applied to a device or appliance that includes a capacitive sensor array such as a capacitive button type arrangement, without limitation.

Using a non-limiting example of a capacitive sensor array that uses a matrix sensor approach of self-capacitance sensors, electrodes may extend in rows and columns to define a "matrix" array of N by M capacitive sensor nodes. The matrix of capacitive sensors may be constructed with an electrode at each capacitive sensor node, each electrode being individually addressable, or each row and column may be an addressable electrode and each capacitive sensor node corresponds to a unique row/column pair. A measurement signal (i.e., a time varying stimulus having an arbitrary waveform that includes one or more of a square wave, a rectangular wave, a triangular wave, and a sinusoidal wave, without limitation) is repeatedly provided to the electrodes of the capacitive sensor array. When an object touches the capacitive sensor array, coupling between the object and the electrodes increases the current drawn on the electrodes which changes (e.g., increases) the self-capacitance Cs of one or more of the capacitive sensors, and this change in sensor capacitance may be detected. For example, if an increase in capacitance is detected while a drive signal is applied to electrode row 2 and electrode column 3, then the location of the touch, or a change in an object already touching, may be row 2, column 3. Interpolation techniques may be used to identify locations between capacitive sensor nodes. Capacitive sensor nodes of a capacitive sensor array may be scanned sequentially by sequencing through combinations of rows and columns of electrodes.

A touch sensing system may include a touch sensor (alone or arranged as a touch screen or incorporated into a touch panel, without limitation) and a touch controller. A touch controller may be a computer processor executing firmware, a special purpose processor such as an application specific integrated circuit (ASIC) or an Intellectual Property (IP) such as one or more functional blocks/modules implemented in integrated circuitry (such as integrated circuitry of a system-on-chip (SoC), without limitation).

As used herein, the term "proximity" encompasses both an object's physical contact with a capacitive sensor and an object's presence within sufficient proximity of a capacitive sensor to be reliably detected. As used herein, the term "touch" should be understood to mean "proximity" unless explicitly indicated otherwise. A disclosed capacitive sensors may respond to an object being brought into proximity of a capacitive sensor, respond to an object that is already in proximity of the capacitive sensor when the capacitive sensor turns on, or a change in quantity or an electrical property of a material of the object that changes capacitance, without limitation.

The term "touch sensor," "capacitive sensor," and "self-capacitive sensor" are used interchangeably herein to refer to a self-capacitive sensor. The terms "touch sensor line" and "sensor line" are used interchangeably herein to refer to a sensor line of a self-capacitive sensor.

As used herein, the term "baseline capacitance" means a magnitude (which may be further characterized as an "amount") of self-capacitance Cs of a sensor line when an object is not in proximity of the sensor line. As used herein, "baseline measurement value" means a value that corresponds to a baseline capacitance, e.g., as a measured value of the baseline capacitance. As used herein, "baseline signal" means a signal that is indicative of a baseline capacitance.

As used herein, the term "induced capacitance" means an amount of a change $\Delta C$ in self-capacitance Cs of a sensor line when a touch sensor is in contact with an object. As used herein, "induced measurement value" means a value that corresponds to an induced capacitance, e.g., as a measured value of the induced capacitance. As used herein "induced signal" means a signal that is indicative of an induced capacitance.

As used herein, the term "measurement capacitance" means the effective self-capacitance of a sensor line when a touch measurement is performed. When a touch sensor is in contact with an object, measurement capacitance may include a baseline capacitance and an induced capacitance, and when a touch sensor is not in contact with an object, an induced capacitance may be absent from a measurement capacitance. As used herein, a "touch measurement value" means a value measurable by a measurement circuit that corresponds to a measurement capacitance. As used herein, "measurement signal" means a signal that is indicative of a measurement capacitance.

A charge transfer associated with a baseline signal may be referred to herein as a "baseline charge transfer" and a charge transfer associated with an induced signal may be referred to herein as an "induced charge transfer."

For the sake of discussion, in some cases a measurement capacitance may be assumed to include a baseline capacitance component and an induced capacitance component, and if a touch sensor is not in contact with an object, then a contribution of the induced capacitance component to the measurement capacitance is assumed to be zero (or inconsequential).

A sensor line of a touch sensor has an associated self-capacitance Cs which may be modeled as a circuit element (referred to herein as a sensor element) having a capacitance Cs. The self-capacitance Cs can be very large depending on the physical realization of a touch sensor, e.g., up to 1 nF (nanofarad) in some touch sensors, without limitation. When an object is in proximity of a sensor line, the object may induce a difference or a change in self-capacitance from a baseline capacitance, the difference or change in self-capacitance denoted $\Delta C$ (referred to herein as "induced capacitance") at the sensor line, where the induced capacitance varies at least partially based on a distance between the object and a sensor line. The induced capacitance is typically less than a few pF (picofarad).

Some touch sensing systems operate by responding to the induced capacitance. An induced capacitance may be observed by a measurement circuit (which may include an ADC as discussed above) and used to determine the presence of an object or a location of an object relative to a touch panel.

One technique for observing an induced capacitance at a touch sensor is to perform a charge transfer technique whereby a change in capacitance is observed from a measurable difference between a baseline charge transfer (i.e., an amount of charge transferred given a specific baseline capacitance) and a measurement charge transfer (i.e., an amount of charge transferred given a baseline capacitance and an induced capacitance). To perform such a measurement, voltage changes (e.g., in the form of voltage pulses referred to herein as "measurement pulses," without limitation) are applied to a drive line and thereby to a pre-charged sensor line. A charge transfer occurs across the baseline capacitance to the sensor line in response to the applied voltage changes. An amplitude of a baseline signal corresponds to an amount of baseline charge transfer.

A baseline capacitance of a respective sensor line of a touch sensor is typically much larger than an induced capacitance, and so a baseline signal is typically also significantly larger than an induced signal. Stated another way, the relative contribution of the baseline signal to a measurement signal is typically much greater than the relative contribution of the induced signal to the measurement signal.

A large baseline signal relative to an induced signal may create challenges for a typical measurement circuit trying to observe an induced signal and/or determine an induced measurement value. As a non-limiting example, an induced measurement value may be over-scaled by a much larger baseline measurement value, and over scaling may result in non-optimal resolution, accuracy, or linearity of a touch sensing system.

Moreover, a measurement circuit of a touch system typically handles measurement signals that in some cases include baseline signals in some cases include both baseline signals and induced signals. Inducing a charge transfer associated with a baseline signal may call for a strong drive capability of the measurement circuit to provide a desired ramp-up/ramp-down by a measurement circuit to, e.g., address settling timing requirements of the ramp, without limitation. A strong drive capability at a measurement circuit is sometimes used to support large charge transfer the fast ramp-up and/or ramp-down. A large driving current that supports large charge transfer over a short time duration may reduce the capability of a measurement circuit to precisely measure an induced capacitance due to an induced charge transfer that is much smaller compared to a capacitance due to a baseline charge transfer (in this case a max charge transfer).

Figure 5:
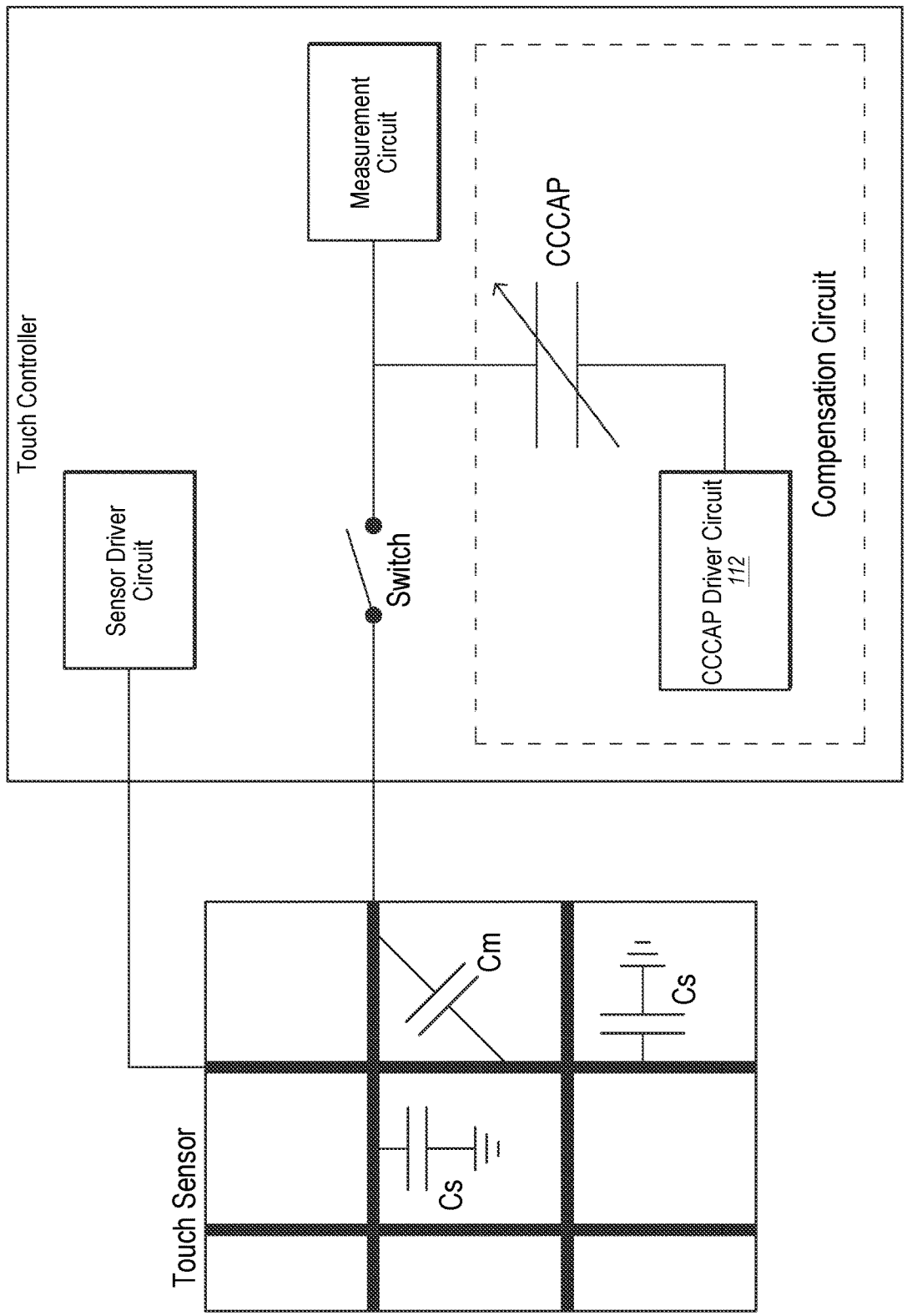
FIG. 5 is a schematic diagram depicting a touch system where the touch controller includes a non-limiting example of a conventional charge compensation circuit.

A technique known to the inventors of this disclosure adds a compensation charge that cancels a baseline signal from a measurement signal. FIG. 5 is a schematic diagram depicting a touch system where the touch controller includes a conventional charge compensation circuit known to the inventors of this disclosure whereby a driver circuit (CC-CAP driver circuit) induces a charge at an output of the compensation circuit by applying a voltage pulse to a charge compensation capacitor (CCCAP). By using such a compensation circuit, a measurement circuit does not necessarily need to support baseline measurement values that are much larger than induced measurement values.

The inventors of this disclosure now appreciate that it would be desirable to have charge cancellation without the large silicon cost of a large CCCAP typically required in conventional charge compensation circuits such as depicted by FIG. 5.

One or more embodiments relate, generally, to an amplified charge compensation circuit that may provide improved charge compensation without some or all of the drawbacks associated with conventional charge compensation circuits known to the inventors of this disclosure. One or more embodiments relate, generally, to touch controllers and touch measurements that implement improved charge compensation circuits and charge compensation. One or more embodiments relate, generally, to touch systems that include touch controllers and charge compensation circuits according to disclosed embodiments.

FIG. 1 is a schematic diagram depicting a touch sensing system 100 that includes a touch controller integrated chip 102 (also referred to herein as "touch controller 102") configured to perform amplified charge cancellation, in accordance with one or more embodiments.

Touch controller 102 includes a pre-charge circuit 106, a measurement circuit 108, first and second switches Switch1 and Switch2, and charge cancellation circuit 104 (also referred to herein as a "charge compensation circuit 104").

Charge cancellation circuit 104 is arranged to inject a charge for cancelling at least a portion of a baseline signal from a measurement signal provided to touch sensor line 116 by measurement circuit 108. Charge cancellation circuit 104 includes a charge compensation capacitor 110 (also referred to herein as "CAP 110"), a CAP driver circuit 112 (also referred to herein as a "driver circuit 112"), and a programmable current conveyor 114 (also referred to herein as "current conveyor 114") coupled in series with CAP 110.

Touch controller 102 is coupled, here by a pad 122 that provides external connectivity, to an external touch sensor line 116 of a touch sensor. Pre-charge circuit 106 is configured, generally, to generate a voltage exhibiting a voltage level corresponding to (e.g., substantially equal to, without limitation) one of two, opposite, voltage rail sources 120 of touch controller 102, e.g., VDD or ground, without limitation. By way of non-limiting example, pre-charge circuit 106 may be a voltage inverter. The switches, Switch1 and Switch2, are CMOS (Complementary Metal-Oxide-Semiconductor) transistor type switches arranged to selectively apply voltage exhibiting the first or the second voltage rail generated by pre-charge circuit 106 to touch sensor line 116 and thereby pre-charge the touch sensor line 116 to a first voltage rail, a second voltage rail, or an intermediate voltage there between, as the case may be.

Measurement circuit 108 is configured, generally, to generate measurement pulses at least partially in response to control signal 124 (e.g., a digital signal assertions of which are used to indicate timing for generating measurement pulses and driver pulses, without limitation). Such a measurement pulse may include a rising edge of a pulse to a voltage V1 (a voltage that exhibits a voltage level that increases generally monotonically manner to V1) or a falling edge of a pulse to voltage V2 (e.g., a voltage that exhibits a voltage level that decreases generally monotonically to V2). The measurement circuit is also configured to detect a measurement capacitance that includes an induced capacitance.

As a non-limiting example, measurement circuit 108 may include a voltage pulse generator or pulse shaping circuit (collectively "a voltage pulse generator"), a current conveyor, an integrator, and an analog-to-digital converter (ADC). In a baseline measurement by measurement circuit 108, a baseline capacitance is observed and an induced capacitance is absent. In a touch measurement, a measurement capacitance is observed that may include both a baseline capacitance and an induced capacitance. Generally, a difference between a touch measurement value (a value representative of baseline capacitance and induced capacitance) and baseline measurement value (a value representative of baseline capacitance) is an induced measurement value (a value representative of induced capacitance). An induced measurement value may be used to inform a logic of a touch controller (logic not depicted by FIG. 1) about contact at a sensor line and a location of such contact at a touch sensor including the respective sensor line.

Driver circuit 112 is configured, generally, to generate a pulsed voltage signal 118 (also referred to herein as a "driver pulse 118") at least partially in response to control signal 124. Since driver circuit 112 is aware of a timing of measurement pulses generated by measurement circuit 108 based at least in part on control signal 124, driver pulse 118 may exhibit a substantially same or an opposite (in terms of polarity—i.e., increasing or decreasing voltage level) voltage change as a measurement pulse generated by measurement circuit 108. In embodiments where current conveyor 114 has/uses a negative output, a driver pulse 118 may, at a given point in time, exhibit a same voltage change polarity as a measurement pulse generated by measurement circuit 108. In embodiments where the current conveyor 114 has/uses a positive output, driver pulse 118 may, at a given point in time, exhibit an opposite voltage change polarity as the measurement pulse generated by measurement circuit 108.

The CAP 110 may be an on-chip capacitor of touch controller 102, as a non-limiting example, an on-chip capacitor including a combination of metal-insulator-metal capacitor and poly-poly capacitor.

Current conveyor 114 is a type of current mode circuit having a response primarily determined by currents (e.g., characteristics of a current signal such as amplitude, peak amplitude, without limitation), and inputs and outputs of such a circuit are currents. Current conveyor 114 is an electronic device, and more specifically, an electronic amplifier that, during operation, exhibits a predetermined current gain in the form of a multiple gain (e.g., about 1.5×, 2×, 10×, 20×, or greater, without limitation), however since current conveyor 114 is programmable and optionally re-programmable, the predetermined current gain may be programmed and is not fixed by design. In one or more embodiments, a current gain of current conveyor 114 is not set to a fractional or unity gain during generation of amplified cancellation charge $\Delta Q_{amp}$ discussed below, however, use of a current conveyor having a current gain programmed as a multiple gain but programmable to a fractional or unity gain does not exceed the scope of this disclosure. In some embodiments, a current gain of current conveyor 114 may be initialized and/or tuned to a desired current gain value. In one or more embodiments, tuning the current gain G of current conveyor 114 is a process by which the current gain G is re-programmed with incremental increases or decreases over multiple re-programming cycles until a condition is met such as a desired current gain is realized, without limitation. Tuning is a non-limiting example of a technique to re-program the current gain of current conveyor 114 to cope with non-ideal conditions in an application. Assume the initialized current gain of the current conveyor 114 does not result in a desired amplified cancellation charge, as a non-limiting example, due to possible process variation of the CCCAP, then the re-programmable conveyor may undergo a tuning process, e.g., sweep the gain up/down one "increment" at a time to attempt to find a programmed value that results in a desired amplified cancellation charge or a smallest tested difference from the desired amplified cancellation charge, without limitation.

Current conveyor 114 is arranged with an input coupled to a top plate of CAP 110 and an output (positive or negative, as the case may be) coupled to a charge transfer path between measurement circuit 108 and pad 122.

In one or more embodiments, a value of a current gain G of current conveyor 114 may be set such that an amplified current that includes amplified cancellation charge $\Delta Q_{amp}$ provided by current conveyor 114 has a magnitude that is sufficient to reduce a charge transfer between touch sensor line 116 and measurement circuit 108 by a pre-specified amount that is known to measurement circuit 108. In one or more embodiments, the pre-specified amount may correspond to an expected magnitude of a baseline charge transfer, or correspond to any amount of charge transfer reduction sufficient to reduce stress on measurement circuit 108 to identify induced capacitance.

Equations 1, 2, and 3, below, illustrate how charge cancellation $\Delta Q_{amp}$ is obtained by using a programmable current conveyor for current conveyor 114.

For an initial cancellation charge $\Delta Q_{initial}$ injected at an input of current conveyor 114 by applying the driver pulse 118 to the bottom plate of CAP 110, $\Delta Q_{initial}$ may be expressed as the amplitude of driver pulse 118 applied to the bottom plate of CAP 110 and denoted as $\Delta Vcapdriver$ and a capacitance of CAP 110 denoted as $C_{CAP}$ is a in Equation 1:

$$\Delta Q\text{initial}=\Delta V\text{capdriver}*C_{CAP} \quad \text{Equation 1}$$

For current conveyor 114, relationships between its input and a positive output are expressed as Equation 2 and Equation 3:

$$\Delta I\text{out}=\Delta I\text{in}*\text{current gain} \quad \text{Equation 2}$$

$$\Delta Q\text{out}=\Delta Q\text{in}*\text{current gain} \quad \text{Equation 3}$$

In a contemplated operation, initial cancellation charge $\Delta Q$initial is received at an input of current conveyor 114, and, in response, the amplified cancellation charge $\Delta Q$amp is generated at an output of current conveyor 114. Current conveyor 114 is arranged at charge cancellation circuit 104 such that the amplified cancellation charge $\Delta Q$amp is injected at the sensor line (and more specifically at the charge transfer path between measurement circuit 108 and pad 122) thereby reducing a measurement charge $\Delta Q$ transferred across touch sensor line 116 due to voltage changes caused by applying the measurement pulse to touch sensor line 116. The relationship of the amplified cancellation charge $\Delta Q$amp to the initial cancellation charge $\Delta Q_{initial}$ is expressed by Equation 4:

$$\Delta Q\text{amp}=\Delta Q\text{initial}*\text{current gain}=\Delta V\text{capdriver}*CAP*\text{current gain} \quad \text{Equation 4}$$

Notably, a smaller area (i.e., in terms of silicon real estate) capacitor may be used for CAP 110 than is used in the conventional compensation circuit known to the inventors of this disclosure (such as CCCAP in FIG. 5). The degree of reduced area is proportional to an increase of the current gain of the current conveyor 114. If current conveyor 114 is programmed with a small gain then CAP 110 may be only slightly smaller than the CCCAP in FIG. 5, and if current conveyor 114 is programmed with a large gain then CAP 110 may be much smaller than CCCAP in FIG. 5. As a non-limiting example, by setting the current gain to 10×, the capacitor value of CAP 110, and therefore its area, can be reduced to 1/10 of conventional charge compensation capacitors (such as CCCAP in FIG. 5) and obtain substantially the same amplified cancellation charge $\Delta Q$amp.

The measurement charge $\Delta Q$ injected at touch sensor line 116 in response to the measurement pulse generated by measurement circuit 108 is reduced by an amount substantially equal to a specified amount such as an expected magnitude of a baseline charge transfer. Accordingly, the amplitude of the measurement signal is correspondingly reduced by the amount of the expected baseline signal and the portion of the measurement signal corresponding to the induced signal remains.

Notably, since the baseline measurement charge is (significantly) reduced, the measurement circuit does not need to support strong current driving capability to drive a baseline capacitor. This means a fast settled ramp at sensor line can be obtained independent (or partly independent) to the large baseline capacitor. Further, the disclosed charge cancellation circuit 104 is more cost effective in terms of the required real-estate (layout area) than conventional compensation circuits known to the inventors of this disclosure.

Figure 2:
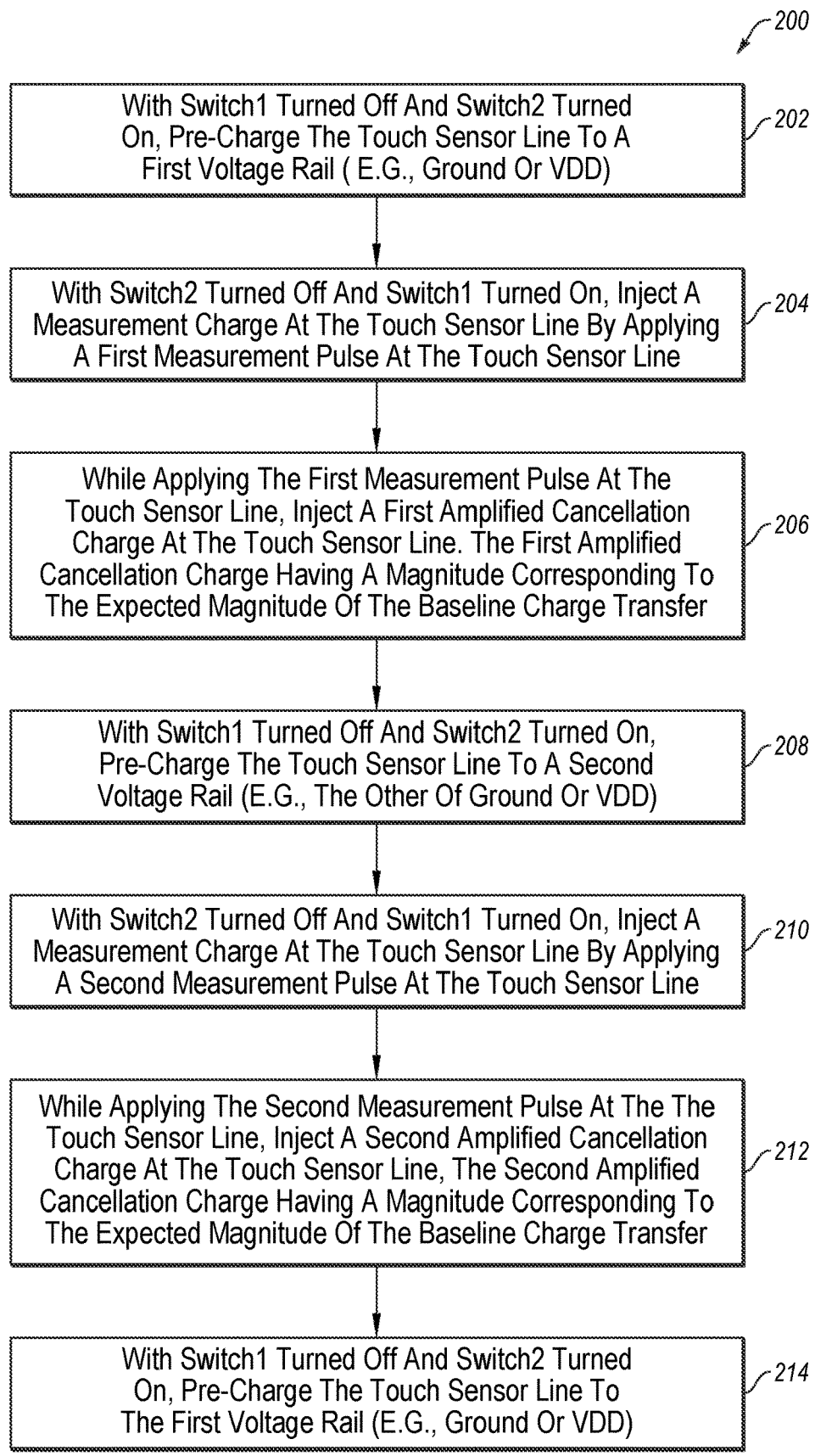
FIG. 2 is a flow diagram depicting a process for performing a self-capacitance measurement of a touch sensor using amplified charge cancellation, in accordance with one or more embodiments.

FIG. 2 is a flow diagram depicting a process 200 for performing a self-capacitance measurement of a touch sensor using amplified charge cancellation in accordance with one or more embodiments.

At operation 202, process 200, with Switch1 is turned OFF and Switch2 is turned ON, a touch sensor line (touch sensor line 116, without limitation) is pre-charged to a first voltage rail (e.g., GROUND or VDD, without limitation) (e.g., by a pre-charge circuit 106, without limitation).

At operation 204, process 200, with Switch2 turned OFF and Switch1 turned ON, injects a measurement charge (e.g., by measurement circuit 108) at the touch sensor line by applying a first measurement pulse (e.g., a pulse with a rising voltage edge to V1, without limitation) at the touch sensor line.

At operation 206, process 200, while the first measurement pulse is applied at the touch sensor line, a first amplified cancellation charge is injected at the sensor line (e.g., by charge cancellation circuit 104, without limitation). The magnitude of the first amplified cancellation charge has a magnitude that is substantially equal to the expected magnitude of the baseline charge transfer.

At operation 208, process 200, with Switch1 turned OFF and Switch2 turned ON, the touch sensor line is pre-charged to a second voltage rail (e.g., the other of VDD or GROUND in operation 202, without limitation) (e.g., by pre-charge circuit 106, without limitation).

At operation 210, process 200, while Switch2 is turned OFF and Switch1 is turned ON, a measurement charge is injected at the sensor line (e.g., by measurement circuit 108) by applying a second measurement pulse (e.g., a falling voltage edge to V2, without limitation) at the touch sensor line.

At operation 212, process 200, while the second measurement pulse is applied at the touch sensor line, injects a second amplified cancellation charge at the sensor line (e.g., by charge cancellation circuit 104). The second amplified cancellation charge has a magnitude that is substantially equal to the expected magnitude of the baseline charge transfer.

At operation 214, process 200, with Switch1 turned OFF and Switch2 turned ON, the touch sensor line is pre-charged to the first voltage rail (e.g., by the pre-charge circuit 106, without limitation).

Figure 3:
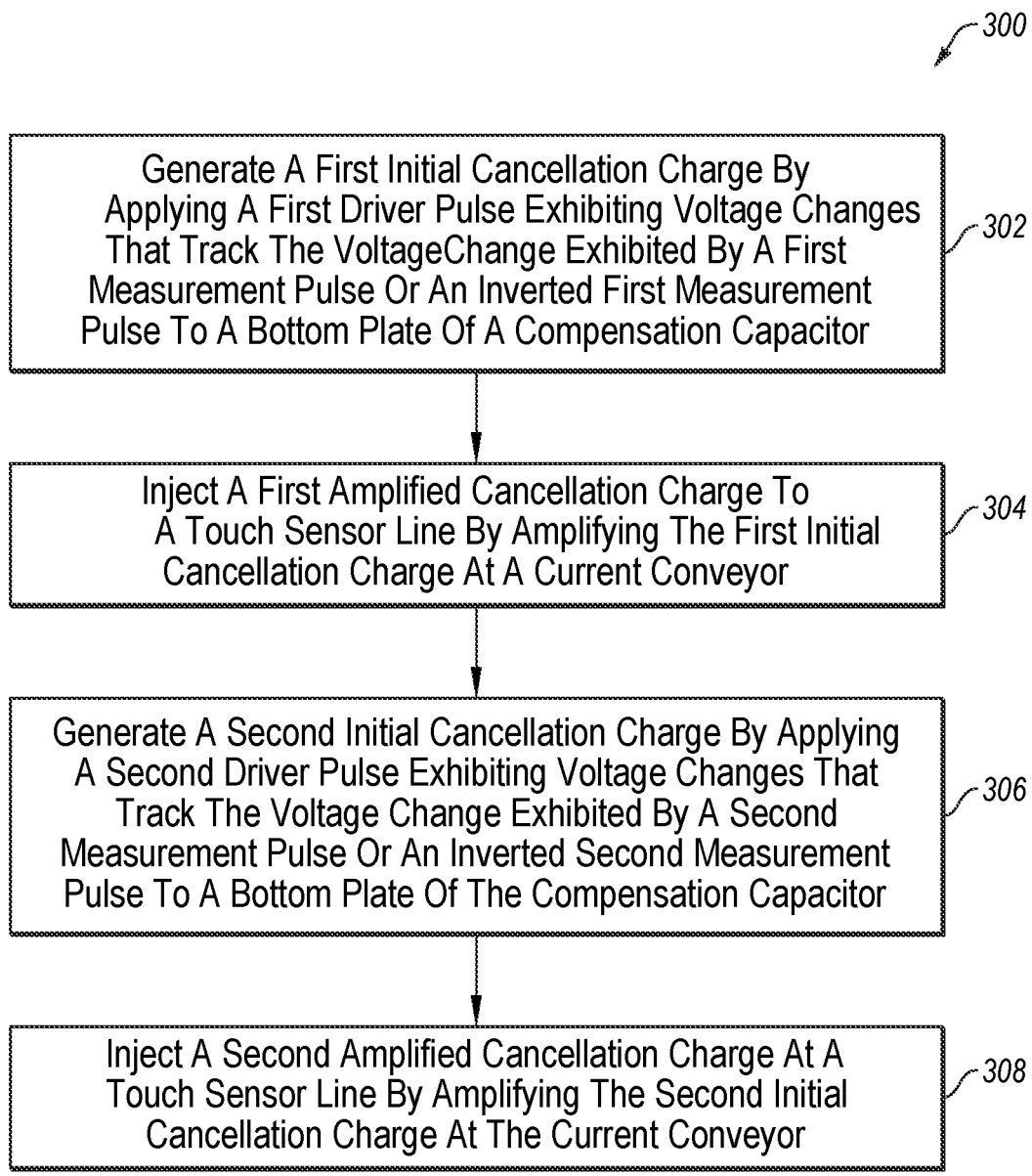
FIG. 3 is a flow diagram depicting a process for injecting cancellation charge during process for performing the self-capacitance measurement depicted by FIG. 2, in accordance with one or more embodiments.

FIG. 3 is a flow diagram depicting a process 300 for injecting an amplified cancellation charge during process 200, in accordance with one or more embodiments. In one or more embodiments, a driver pulse exhibiting a voltage change that is the same or opposite of the voltage change exhibited by a measurement pulse is generated. One of the driver pulses generated by process 300 should exhibit a voltage change that is the same as the voltage change exhibited by the measurement pulse and one of the driver pulses generated by process 300 should exhibit a voltage change that is the opposite as the voltage change exhibited by the measurement pulse.

At operation 302, process 300 generates a first initial cancellation charge by applying a driver pulse with a voltage change exhibiting voltage changes that track the voltage change exhibited by a first measurement pulse or an inverted first measurement pulse to a bottom plate of a compensation capacitor (as the case may be).

At operation 304, process 300 injects the first amplified cancellation charge at a touch sensor line by amplifying the first initial cancellation charge at a current conveyor.

At operation 306, process 300 generates a second initial cancellation charge by applying a second driver pulse exhibiting voltage changes that track the voltage change exhibited by a second measurement pulse or an inverted second measurement pulse (as the case may be).

At operation 308, process 300 injects a second amplified cancellation charge at the touch sensor line by amplifying the second initial cancellation charge at the current conveyor.

Figure 4:
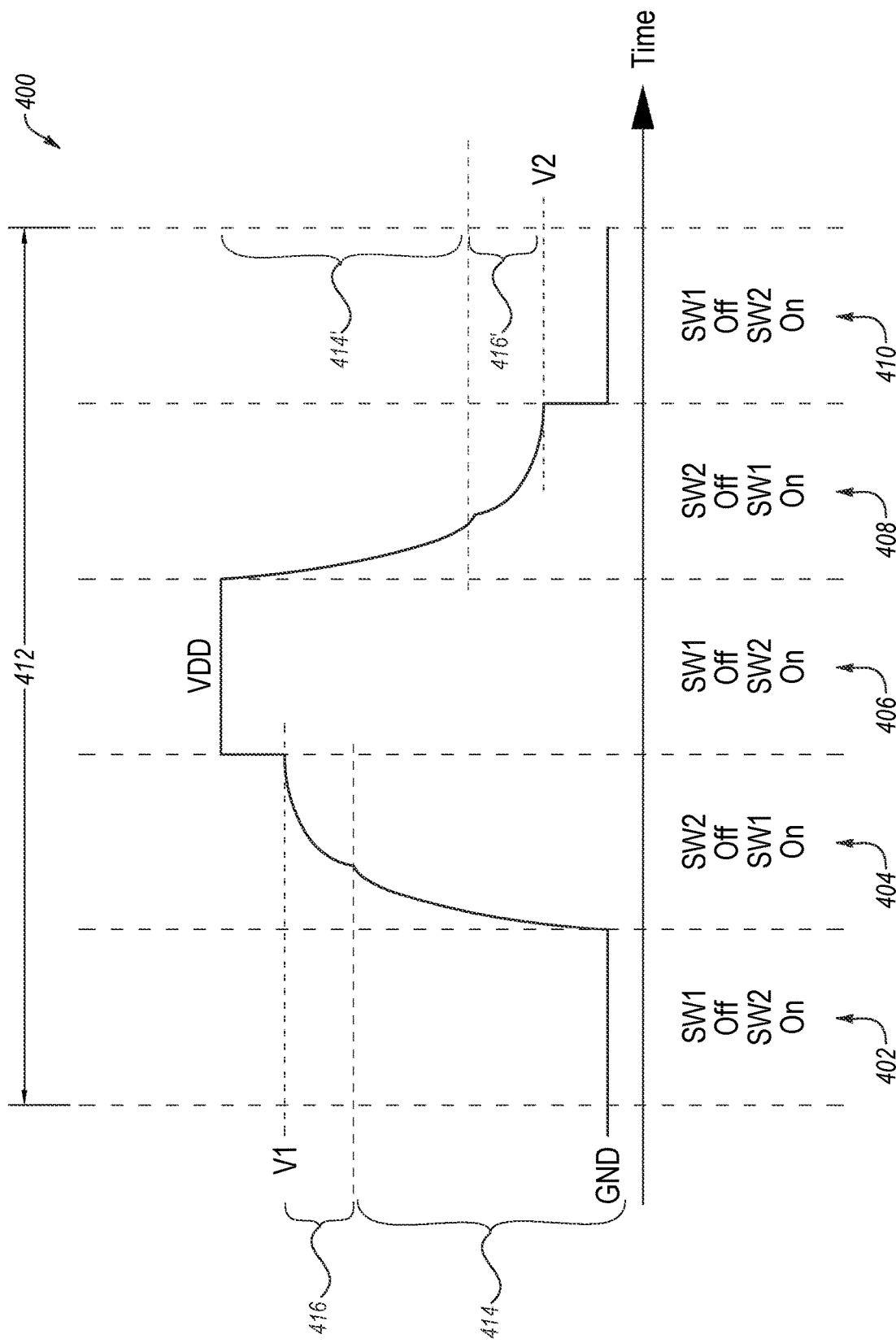
FIG. 4 is a diagram depicting a waveform of a scan signal generated by voltage levels at the touch sensor line over a scan time duration observable from the pad used to couple the touch controller of FIG. 1 to a touch sensor line.

FIG. 4 is a diagram depicting a waveform 400 of a baseline capacitor scan signal generated by voltage levels at the touch sensor line 116 over a scan time duration 412 observable from the pad 122 of FIG. 1. In the specific example depicted by FIG. 4, the first voltage rail refers to GROUND and the second voltage rail refers to VDD. The rising edge to voltage level V1 at the touch sensor line 116 includes at least two ramp slopes, a first ramp slope 414 and a second ramp slope 416. The falling edge to voltage level V2 from VDD at the touch sensor line 116 includes at least two ramp slopes, a first ramp slope 414' and a second ramp slope 416'. The voltage at the touch sensor line 116 exhibits first ramp slope 414 between GROUND and about 90% of V1 (and with respect to the falling edge, similarly exhibits first ramp slope 414' between VDD and about 90% of VDD-V2) during a first portion of first measurement phase 404 (and with respect to the falling edge, during a first portion of second measurement phase 408) due to the charge cancellation on the touch sensor line 116 described herein, and measurement circuit 108 does not generate a driving current to charge the baseline capacitor. The voltage at the touch sensor line 116 exhibits second ramp slope 416 between about 90% V1 and about V1 (and with respect to the falling edge, similarly exhibits first ramp slope 416' between about 90% of VDD-V2 and about V2) during a second, later, portion of first measurement phase 404 (and with respect to the falling edge, during a second portion of second measurement phase 408). Measurement circuit 108 generates a driving current to charge the baseline capacitor for about the last 10% of V1 (and with respect to the falling edge, about the last 10% of VDD-V2). The total driving current generated by measurement circuit 108 to drive a voltage change at the baseline capacitor from GROUND to V1 and from VDD to VDD-V2 is attributed to about 10% or less of V1 and VDD-V2. Notably, with the charge amplification by current conveyor 114, the remaining 10% of V1 and to V2 is sufficiently compensated by programming the current gain G of current conveyor 114 such that a desired amplified cancellation charge ΔQamp is obtained to cancel a totality of the baseline charge transfer. Accordingly, the measurement circuit 108 does not have to provide driving current to drive the baseline capacitor.

The depiction includes callouts for operation and switch control of Switch1 and Switch2 during five phases of scan time duration 412: first pre-charge phase 402 (to GROUND), first measurement phase 404 during which a first measurement pulse is applied to generate a rising voltage pulse to V1, second pre-charge phase 406 (to VDD), second measurement phase 408 during which a second measurement pulse is applied to generate a falling voltage pulse to V2, and third pre-charge phase 410 (to GROUND again).

Notably, with minor alterations and/or additions to disclosed embodiments that will be apparent to a person having ordinary skill in the art appraised of this disclosure, the polarities discussed herein could be reversed and intermediate voltage levels could be used without exceeding the scope of this disclosure.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims, without limitation) are generally intended as "open" terms (e.g., the term "including" should be interpreted as "including, but not limited to," the term "having" should be interpreted as "having at least," the term "includes" should be interpreted as "includes, but is not limited to," without limitation). As used herein, the term "each" means some or a totality. As used herein, the term "each and every" means a totality.

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more," without limitation); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations, without limitation). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additional non-limiting embodiments of the disclosure include:

Embodiment 1: A charge cancellation circuit, comprising: a capacitor; a driver circuit arranged to apply a pulsed voltage signal to the capacitor; and a current conveyor having a programmable gain, the current conveyor arranged to amplify an initial charge generated by the capacitor in response to the pulsed voltage signal and provide an amplified charge to an output of the charge cancellation circuit.

Embodiment 2: The charge cancellation circuit according to Embodiment 1, wherein the current conveyor comprises one of a positive output or a negative output.

Embodiment 3: The charge cancellation circuit according to any of Embodiments 1 and 2, wherein the negative output is configured to invert a polarity of an output signal relative to a polarity of an input signal.

Embodiment 4: The charge cancellation circuit according to any of Embodiments 1 through 3, wherein the positive output is configured to track a polarity of an output signal relative to a polarity of an input signal.

Embodiment 5: A method of reducing charge transfer across a capacitor of a sense line of a touch sensing system, comprising: pre-charging a touch sensor line to a first voltage rail; injecting a first measurement charge at the touch sensor line; injecting a first amplified cancellation charge at the touch sensor line; pre-charging the touch sensor line to a second voltage rail; injecting a second measurement charge at the touch sensor line; injecting a second amplified cancellation charge at the touch sensor line; and pre-charging the touch sensor line to the first voltage rail.

Embodiment 6: The method according to Embodiment 5, wherein the injecting the first measurement charge or the second measurement charge at the touch sensor line comprises: applying a first or a second measurement pulse at the touch sensor line to generate the first measurement charge or the second measurement charge.

Embodiment 7: The method according to any of Embodiments 5 and 6, wherein the injecting the first amplified cancellation charge or the second amplified cancellation charge at the touch sensor line comprises: applying a first or a second driver pulse at a compensation capacitor to generate the first amplified cancellation charge or the second amplified cancellation charge, respectively.

Embodiment 8: The method according to any of Embodiments 5 through 7, comprising generating the first or the second driver pulse exhibiting voltage changes that track voltage changes exhibited by a measurement pulse generated for injecting the first measurement charge or the second measurement charge at the touch sensor line.

Embodiment 9: The method according to any of Embodiments 5 through 8, comprising generating the first or the second driver pulse exhibiting voltage changes that track voltage changes exhibited by an inverted measurement pulse corresponding to a measurement pulse generated for injecting the first measurement charge or the second measurement charge at the touch sensor line.

Embodiment 10: A touch controller, comprising: a pad; a pre-charge circuit; a measurement circuit; and a charge cancellation circuit arranged to provide an amplified cancelation charge to a charge transfer path between the pad and the measurement circuit, wherein the charge cancellation circuit comprises: a capacitor; a driver circuit arranged to apply a pulsed voltage signal to the capacitor; and a current conveyor having a programmable gain arranged to amplify an initial charge generated by the capacitor in response to the pulsed voltage signal and provide an amplified charge to an output of the charge cancellation circuit.

Embodiment 11: The touch controller according to Embodiment 10, wherein the driver circuit is configured to generate a driver pulse exhibiting voltage changes that track voltage changes exhibited by a measurement pulse generated by the measurement circuit.

Embodiment 12: The touch controller according to any of Embodiments 10 and 11, wherein the driver circuit is configured to generate a driver pulse exhibiting voltage changes that track voltage changes exhibited by an inverted measurement pulse corresponding to a measurement pulse generated by the measurement circuit.

Embodiment 13: The touch controller according to any of Embodiments 10 through 12, wherein the output of the current conveyor is one of a negative output and a positive output.

Embodiment 14: The touch controller according to any of Embodiments 10 through 13, comprising: a first switch arranged to selectively couple the pre-charge circuit to the pad; and a second switch arranged to selectively couple the measurement circuit and the charge cancellation circuit to the pad.

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. A charge cancellation circuit, comprising:
   a capacitor;
   a driver circuit directly coupled to a first plate of the capacitor to apply a pulsed voltage signal to the capacitor; and
   a current conveyor having a programmable gain, the current conveyor directly coupled to a second plate of the capacitor to amplify an initial charge generated by the capacitor in response to the pulsed voltage signal and provide the amplified initial charge to an output of the charge cancellation circuit.

2. The charge cancellation circuit of claim 1, wherein the current conveyor comprises one of a positive output or a negative output.

3. The charge cancellation circuit of claim 2, wherein the negative output is configured to invert a polarity of an output signal relative to a polarity of an input signal.

4. The charge cancellation circuit of claim 3, wherein the positive output is configured to track a polarity of an output signal relative to a polarity of an input signal.

5. The charge cancellation circuit of claim 1, wherein the output of the charge cancellation circuit is to provide the amplified initial charge to a touch sensor line.

6. A method of reducing charge transfer across a capacitor of a sense line of a touch sensing system, comprising:
   pre-charging a touch sensor line to a first voltage rail;
   injecting a first measurement charge at the touch sensor line;
   amplifying a first cancellation charge;
   injecting the amplified first cancellation charge at the touch sensor line;
   pre-charging the touch sensor line to a second voltage rail;
   injecting a second measurement charge at the touch sensor line;
   amplifying a second cancellation charge;
   injecting the amplified second cancellation charge at the touch sensor line; and
   pre-charging the touch sensor line to the first voltage rail.

7. The method of claim 6, wherein the injecting the first measurement charge or the second measurement charge at the touch sensor line comprises:
   applying a first or a second measurement pulse at the touch sensor line to generate the first measurement charge or the second measurement charge.

8. The method of claim 6, wherein the injecting the amplified first cancellation charge or the amplified second cancellation charge at the touch sensor line comprises:
   applying a first or a second driver pulse at a compensation capacitor to generate the amplified first cancellation charge or the amplified second cancellation charge, respectively.

9. The method of claim 8, comprising generating the first or the second driver pulse exhibiting voltage changes that track voltage changes exhibited by a measurement pulse generated for injecting the first measurement charge or the second measurement charge at the touch sensor line.

10. The method of claim 8, comprising generating the first or the second driver pulse exhibiting voltage changes that track voltage changes exhibited by an inverted measurement pulse corresponding to a measurement pulse generated for injecting the first measurement charge or the second measurement charge at the touch sensor line.

11. A touch controller, comprising:
    a pad;
    a pre-charge circuit;
    a measurement circuit; and
    a charge cancellation circuit arranged to provide an amplified cancelation charge to a charge transfer path between the pad and the measurement circuit, wherein the charge cancellation circuit comprises:
    a capacitor;
    a driver circuit arranged to apply a pulsed voltage signal to the capacitor; and
    a current conveyor having a programmable gain arranged to amplify an initial charge generated by the capacitor in response to the pulsed voltage signal and provide the amplified initial charge to an output of the charge cancellation circuit,
    wherein an output of the charge cancellation circuit is operably coupled to provide the amplified initial charge to a signal path between the pad and the measurement circuit.

12. The touch controller of claim 11, wherein the driver circuit is configured to generate a driver pulse exhibiting voltage changes that track voltage changes exhibited by a measurement pulse generated by the measurement circuit.

13. The touch controller of claim 11, wherein the driver circuit is configured to generate a driver pulse exhibiting voltage changes that track voltage changes exhibited by an inverted measurement pulse corresponding to a measurement pulse generated by the measurement circuit.

14. The touch controller of claim 11, wherein the output of the current conveyor is one of a negative output and a positive output.

15. The touch controller of claim 11, comprising:
    a first switch arranged to selectively couple the pre-charge circuit to the pad; and
    a second switch arranged to selectively couple the measurement circuit and the charge cancellation circuit to the pad.

* * * * *